(12) United States Patent
Matsuo

(10) Patent No.: US 8,217,551 B2  
(45) Date of Patent: Jul. 10, 2012

(54) SURFACE ACOUSTIC WAVE PACKAGE WITH AIR HOLE THAT PREVENTS THERMAL EXPANSION

(75) Inventor: Hiroshi Matsuo, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 473 days.

(21) Appl. No.: 12/576,863

(22) Filed: Oct. 9, 2009

(65) Prior Publication Data

US 2010/0096946 A1 Apr. 22, 2010

(30) Foreign Application Priority Data

Oct. 21, 2008 (JP) ................................. 2008-271343

(51) Int. Cl.
  *H01L 41/04* (2006.01)
  *H01L 41/08* (2006.01)
  *H03H 9/25* (2006.01)

(52) U.S. Cl. ...................... 310/313 R; 310/344; 310/348

(58) Field of Classification Search .................. 310/313, 310/344, 348
See application file for complete search history.

(56) References Cited

U.S. PATENT DOCUMENTS

| 7,183,125 B2 * | 2/2007 | Anzai et al. .................... 438/22 |
| 2006/0255691 A1 * | 11/2006 | Kuroda et al. ................ 310/348 |
| 2008/0130205 A1 | 6/2008 | Matsuo |

FOREIGN PATENT DOCUMENTS

| JP | 2001-094389 A | | 4/2001 |
| JP | 2001267869 A | * | 9/2001 |
| JP | 2008-131152 A | | 6/2008 |

* cited by examiner

*Primary Examiner* — Jaydi San Martin  
(74) *Attorney, Agent, or Firm* — Chen Yoshimura LLP

(57) ABSTRACT

A surface acoustic wave device includes a surface acoustic wave (SAW) chip, a base that is made of resin and surround the SAW chip, and a cap that is made of resin and is bonded, by a seal member, to the base so as to define a cavity in which the SAW chip is sealed with the cap and the base, the cavity communicating with an outside of the surface acoustic wave device through a through hole formed in the seal member.

7 Claims, 2 Drawing Sheets

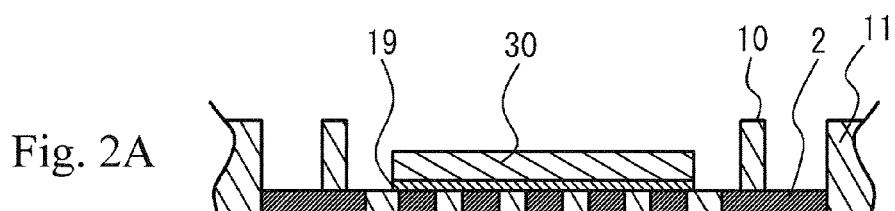
Fig. 2A
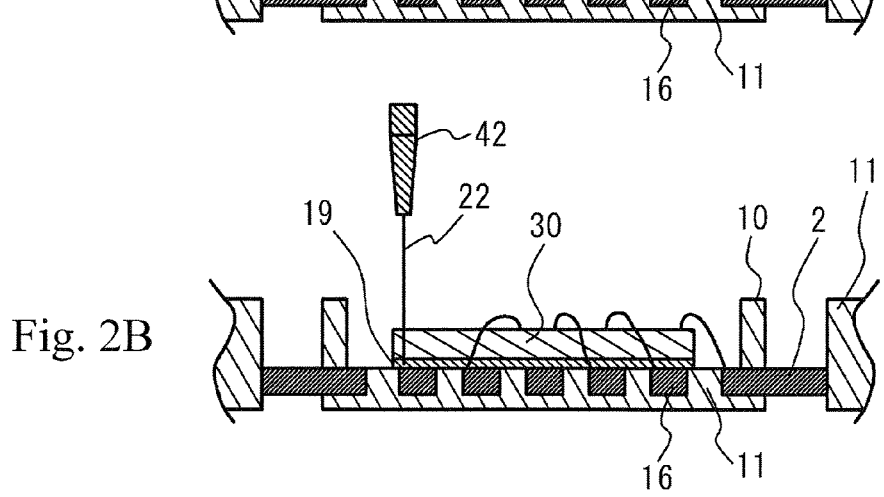
Fig. 2B
Fig. 2C
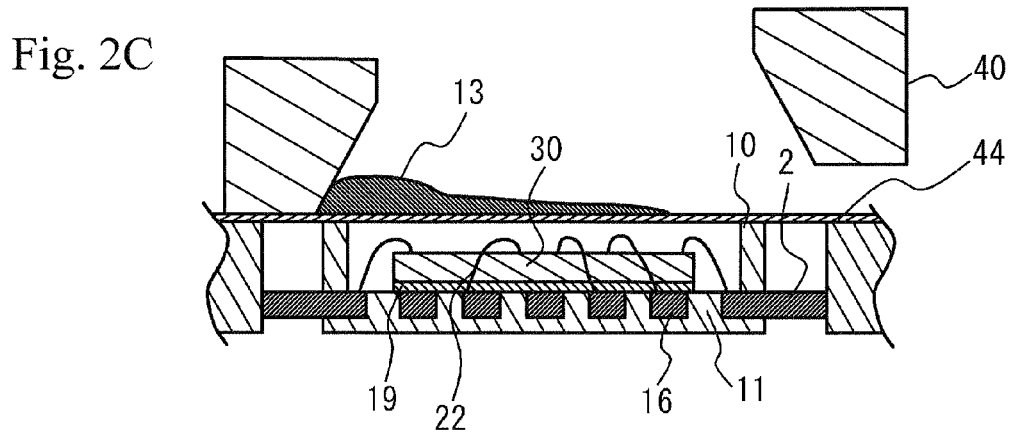
Fig. 2D
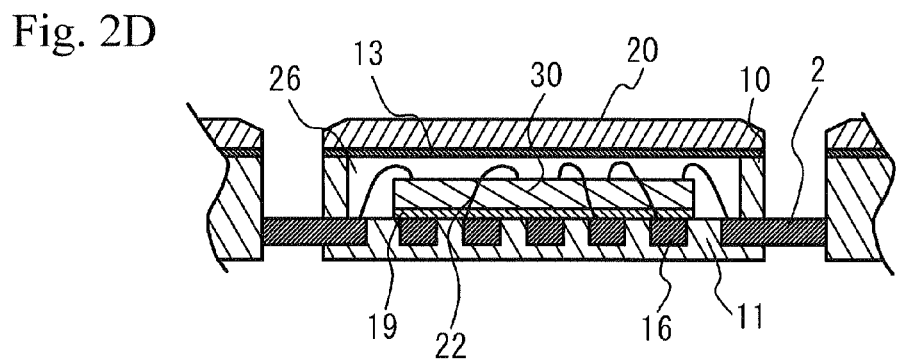

SURFACE ACOUSTIC WAVE PACKAGE WITH AIR HOLE THAT PREVENTS THERMAL EXPANSION

CROSS-REFERENCE TO RELATED APPLICATION

This application is based upon and claims the benefit of priority of the prior Japanese Patent Application No. 2008-271343, filed on Oct. 21, 2008, the entire contents of which are incorporated herein by reference.

FIELD

A certain aspect of the embodiments discussed herein is related to a surface acoustic wave device.

BACKGROUND

Surface acoustic wave (SAW) devices have been widely used in various fields as signal filters for electric and electronic equipment that utilizes electromagnetic waves. For example, the SAW devices are applied to frequency filters for video signals processed in television sets and video tape recorders. Generally, the SAW device has a SAW chip formed by a piezoelectric substrate made of a piezoelectric material such as $LiNbO_3$ or $LiTaO_3$ on which comb electrodes for exciting surface acoustic waves are formed. The SAW chip is housed in a package to form the SAW device. The surface acoustic waves are propagated on the surface of the piezoelectric substrate. Thus, a protection film is not provided on the piezoelectric substrate and the comb electrodes, and a cavity is formed thereon. The SAW chip is sealed and protected.

For cost reduction of the SAW device, the SAW chip may be housed in a package that is made of resin and has a cavity. More particularly, the SAW chip is mounted on a base made of resin, and a cap is bonded to the base so as to seal the SAW chip. Thus, the SAW chip is sealed in the cavity defined by the base and the cap.

Japanese Patent Application Publication No. 2001-94389 discloses a SAW device in which convex and concave portions are provided in the bonding interface between the base and the cap for the purpose of improving the bonding strength.

Japanese Patent Application Publication No. 2008-131152 discloses a SAW device in which the bonding interface between the base and the cap is subjected to surface texturing or the like in order to improve the bonding strength.

The base and the cap are bonded by an adhesive applied to an outer portion of the base. The adhesive goes around the outer portion of the base, and hermetic sealing realized by the base and the cap is improved. In a process of mounting the SAW device on a printed-circuit board or the like, a heat history such as reflow is applied to the SAW device, and the inside of the package thermally expands. Thus, the base or the cap may pop on the printed-circuit board, and there is a difficulty in placing the SAW device in position. The base or the cap may be cracked and destroyed in the worst case.

SUMMARY

According to an aspect of the present invention, there is provided a surface acoustic wave device including: a surface acoustic wave (SAW) chip; a base that is made of resin and surround the SAW chip; and a cap that is made of resin and is bonded, by a seal member, to the base so as to define a cavity in which the SAW chip is sealed with the cap and the base, the cavity communicating with an outside of the surface acoustic wave device through a through hole formed in the seal member.

The object and advantages of the invention will be realized and attained by means of the elements and combinations particularly pointed out in the claims It is to be understood that both the foregoing general description and the following detailed description are exemplary and explanatory and are not restrictive of the invention, as claimed.

BRIEF DESCRIPTION OF DRAWINGS

FIGS. 2A through 2D are cross-sectional views illustrating a method for fabricating the SAW device of the embodiment.

DESCRIPTION OF EMBODIMENTS

Embodiments of the present invention are described below with reference to the accompanying drawings.

Figure 1A:
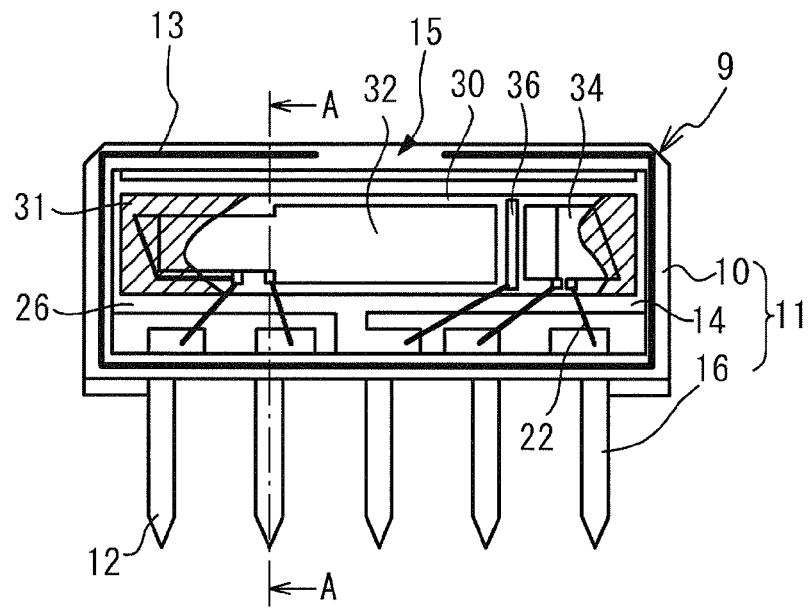
FIG. 1A is a plan view of a SAW device in accordance with an embodiment.
Figure 1B:
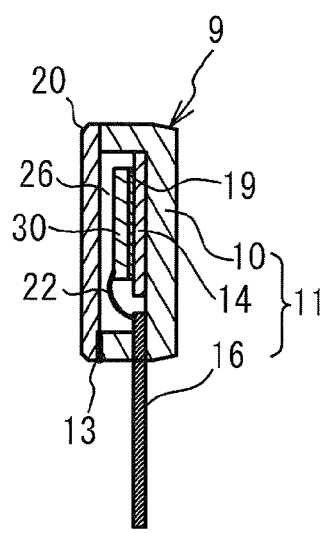
FIG. 1B is a cross-sectional view taken along a line A-A illustrated in FIG. 1A.
Figure 1C:
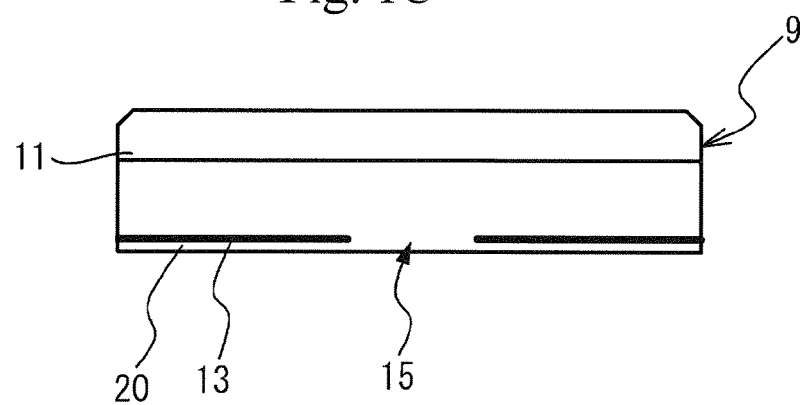
FIG. 1C is a side view of the SAW device.

FIG. 1A is a plan view of a SAW device in accordance with an embodiment,

FIG. 1B is a cross-sectional view taken along a line A-A illustrated in FIG. 1A, and FIG. 1C is a side view of the SAW device.

As illustrated in FIGS. 1A and 1B, the SAW device of the first embodiment has a SAW chip 30, a base 11 and a cap 20. The base 11 may be made of thermoset epoxy resin, and the cap 20 may be made of thermoset epoxy resin. A package 9 includes the base 11 and the cap 20. The base 11 has an outer round part 10 formed around the SAW chip 30, a die pad 14, and a lead frame 16, which is connected to the SAW chip 30 and is made of a metal such as a copper alloy. The outer round part 10 of the base 11 is formed like a bank so as to surround the die pad 14. That is, the base 11 surrounds the SAW chip 30. The SAW chip 30 is mounted on the die pad 14 by an adhesive of thermoset epoxy resin. An acoustic power absorbing member 31 is provided on the SAW chip 30. An input part 32, an output part 34 and a ground part 36 are formed on the SAW chip 30, and are electrically connected to the lead frame 16 by wires 22, which may be made of a metal such as gold.

As illustrated in FIG. 1B, the cap 20 is bonded to the base 11 so as to define a cavity 26 for sealing the SAW chip 30. The base 11 and the cap 20 are bonded by, for example, epoxy adhesive and a seal member 13 provided to the outer round part 10. As illustrated in FIGS. 1A and 1B, the lead frame 16 connected to the SAW chip 30 protrudes from the cavity 26 in a direction.

As illustrated in FIGS. 1A through 1C, a through hole 15 is provided in the seal member 13 on a side opposite thereof to the side on which the lead frame 16 protrudes from the cavity 26. The cavity 26 communicates with the outside of the seal member 13 through the through hole 15.

A description will now be given of a method for fabricating the SAW device of the embodiment. FIGS. 2A through 2D are cross-sectional views illustrating the method for fabricating the SAW device.

As illustrated in FIG. 2A, the SAW chip 30 is mounted on the die pad 14 (not illustrated) of the base 11 by an adhesive 19. The base 11 is joined to adjacent bases 11 via joint portions 2 formed by a lead frame.

As illustrated in FIG. 2B, the input part 32, the output part 34 and the ground part 36 of the SAW chip 30 are connected to the lead frame 16 by the wires 22 by using a wire bonder 42.

As illustrated in FIG. 2C, a mask 44 is provided on the base 11 and is coated with the seal member 13 made of epoxy resin by a print squeegee 40. The mask 44 has an opening that overlaps the outer round part 10. Thus, the seal member 13 is coated on the outer round part 10. The outer round part 10 located on the side opposite to the side on which the lead frame 16 protrudes from the outer round part 10 is covered with the mask 44 that prevents the outer round part from being coated with the seal member 13.

As illustrated in FIG. 2D, the base 11 and the cap 20 are bonded. The part of the outer round part 10 that is not coated with the seal member 13 becomes the through hole 15. That is, the through hole 15 is a part of the outer round part 10 that is not provided with the seal member 13. The SAW device of the embodiment is fabricated by the method including the steps illustrated in FIGS. 2A through 2D.

According to the present embodiment, the through hole 15 functions as an air hole between the cavity 26 and the outside of the SAW device. It is thus possible to prevent to suppress thermal expansion of the inside of the package 9 due to the heat history such as reflow and to prevent the base 11 or the cap 20 from popping or being damaged.

The through hole 15 is a part of the outer round part 10 that is not covered with the seal member 13. Thus, as illustrated in FIG. 2C, the through hole 15 may easily be formed by defining an area on the outer round part 10 that is not coated with the seal member 13. That is, there is no need to employ a particular process for forming the through hole 15. Since the through hole 15 may be formed by a simple process, cost reduction of the SAW device is achieved. The height of the through hole 15 is equal to the thickness of the seal member 13. That is, the through hole 15 is very fine, and functions as an air hole that does not allow foreign materials to pass therethrough.

The SAW device may be mounted on a printed-circuit board or the like in such a manner that the lead frame is soldered thereto. The lead frame 16 protrudes in one direction, and the through hole 15 is provided on the side opposite to the side on which the lead frame 16 protrudes. It is thus possible to prevent foreign materials such as flux used for soldering from reaching the through hole 15 and entering into the package 9.

As described above, it is possible to prevent the foreign materials from entering into the SAW device by sealing the SAW chip 30 with the cap 20 and the seal member 13. Generally, the SAW chip is used at frequencies lower than those of a film-bulk acoustic resonator (FBAR). Thus, the performance of the SAW chip does not change greatly even with the proposed unique seal structure that has the through hole 15 and is not highly hermetic. The through hole 15 that functions as an air hole prevents thermal expansion in the package 9. That is, the through hole 15 realizes both the protection of the SAW chip 30 and suppression of the thermal expansion of the inside of the package 9.

The SAW chip 30 is sealed within the cavity 26. This avoids the use of a protection film on the SAW chip 30. It is thus possible to secure a space around the SAW chip 30.

The base 11 and the cap 20 are not limited to thermoset epoxy resin but may be made of thermoplastic resin.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A surface acoustic wave device comprising:
   a surface acoustic wave (SAW) chip;
   a base that is made of resin and surround the SAW chip; and
   a cap that is made of resin and is bonded, by a seal member, to the base so as to define a cavity in which the SAW chip is sealed with the cap and the base,
   the cavity communicating with an outside of the surface acoustic wave device through a through hole formed in the seal member.

2. The surface acoustic wave device according to claim 1, wherein the base has an outer round part provided around the SAW chip, and the seal member is provided in the outer round part.

3. The surface acoustic wave device according to claim 2, wherein the through hole is a part of the outer round part in which the seal member is not provided.

4. The surface acoustic wave device according to claim 1, wherein the base has a lead frame that is connected to the SAW chip and protrudes from the cavity and extends beyond the base, and the through hole is provided on a side of the surface acoustic wave device opposite to another side thereof on which the lead frame protrudes from the cavity.

5. The surface acoustic wave device according to claim 4, wherein the lead frame protrudes from the cavity in one direction.

6. The surface acoustic wave device according to claim 1, wherein the seal member is epoxy resin.

7. The surface acoustic wave device according to claim 1, wherein the base and the cap are made of one of thermoset resin and thermoplastic resin.

* * * * *